(12) United States Patent
Lv et al.

(10) Patent No.: US 11,403,017 B2
(45) Date of Patent: Aug. 2, 2022

(54) DATA COMPRESSION METHOD, ELECTRONIC DEVICE AND COMPUTER PROGRAM PRODUCT

(71) Applicant: EMC IP Holding Company LLC, Hopkinton, MA (US)

(72) Inventors: Shuo Lv, Beijing (CN); Huan Chen, Beijing (CN); Chen Gong, Beijing (CN); Ming Zhang, Beijing (CN); Leihu Zhang, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 156 days.

(21) Appl. No.: 17/028,158

(22) Filed: Sep. 22, 2020

(65) Prior Publication Data
US 2022/0035526 A1    Feb. 3, 2022

(30) Foreign Application Priority Data
Jul. 31, 2020   (CN) .......................... 202010756581.7

(51) Int. Cl.
*H03M 7/00*    (2006.01)
*G06F 3/06*    (2006.01)
*H03M 7/30*    (2006.01)
*H03M 7/40*    (2006.01)

(52) U.S. Cl.
CPC ............ *G06F 3/064* (2013.01); *G06F 3/0608* (2013.01); *G06F 3/0673* (2013.01); *H03M 7/30* (2013.01); *H03M 7/00* (2013.01); *H03M 7/40* (2013.01); *H03M 7/4031* (2013.01)

(58) Field of Classification Search
CPC ...... G06F 3/064; G06F 3/0608; G06F 3/0673; H03M 7/30; H03M 7/40; H03M 7/4031; H03M 7/00
See application file for complete search history.

(56) References Cited

U.S. PATENT DOCUMENTS

| | | | |
|---|---|---|---|
| 6,320,522 B1 * | 11/2001 | Satoh ...................... | H03M 7/40 341/51 |
| 10,938,414 B1 | 3/2021 | Tohlen et al. | |
| 2020/0272364 A1 | 8/2020 | Zhao et al. | |
| 2022/0061701 A1 | 3/2022 | Krishnan et al. | |
| 2022/0066647 A1 | 3/2022 | Krasner et al. | |

* cited by examiner

*Primary Examiner* — Joseph J Lauture
(74) *Attorney, Agent, or Firm* — BainwoodHuang (57) ABSTRACT

A data compression technique involves: selecting, from a data block, a plurality of bit strings as sample data. The technique further involves: determining a set of characters included in the sample data. Each character in the set of characters is represented by at least one bit string among the plurality of bit strings. The technique further involves: compressing the data block if statistical characteristics of the set of characters match predetermined statistical characteristics. Accordingly, incompressible data can be filtered out efficiently and accurately, so as to utilize computing resources more efficiently.

21 Claims, 5 Drawing Sheets

DATA COMPRESSION METHOD, ELECTRONIC DEVICE AND COMPUTER PROGRAM PRODUCT

CROSS-REFERENCE TO RELATED APPLICATION

This application claims priority to Chinese Patent Application No. CN202010756581.7, on file at the China National Intellectual Property Administration (CNIPA), having a filing date of Jul. 31, 2020, and having "DATA COMPRESSION METHOD, ELECTRONIC DEVICE AND COMPUTER PROGRAM PRODUCT" as a title, the contents and teachings of which are herein incorporated by reference in their entirety.

TECHNICAL FIELD

Embodiments of the present disclosure relate to the field of data processing, and more particularly, to a data compression method, an electronic device, and a computer program product.

BACKGROUND

Data compression is a process of expressing information with fewer bits (or other information-related units) according to a specific coding mechanism than those uncoded. In data processing, data compression is widely used to reduce the amount of data required to process, store, and transmit a given amount of information. For example, data compression before storage can reduce the required storage space; data compression before transmission can increase the communication efficiency of a communication channel; and data compression before encryption can reduce redundancy and be more secure. However, data compression consumes a lot of computing resources, for example, the resources of a central processing unit (CPU).

SUMMARY OF THE INVENTION

The embodiments of the present disclosure provide a data compression scheme.

In a first aspect of the present disclosure, a data compression method is provided. The method includes: selecting, from a data block, a plurality of bit strings as sample data. The method also includes: determining a set of characters included in the sample data. Each character in the set of characters is represented by at least one bit string among the plurality of bit strings. The method further includes: compressing the data block if statistical characteristics of the set of characters match predetermined statistical characteristics.

In a second aspect of the present disclosure, an electronic device is provided. The electronic device includes a processor and a memory that is coupled to the processor and has instructions stored therein. The instructions, when executed by the processor, cause the device to execute actions. The actions include: selecting, from a data block, a plurality of bit strings as sample data. The actions also include: determining a set of characters included in the sample data. Each character in the set of characters is represented by at least one bit string among the plurality of bit strings. The actions further include: compressing the data block if statistical characteristics of the set of characters match predetermined statistical characteristics.

In a third aspect of the present disclosure, a computer program product is provided. The computer program product is tangibly stored on a computer-readable medium and includes machine-executable instructions. The machine-executable instructions, when executed, cause a machine to perform the method according to the first aspect.

The summary part is provided to introduce the selection of concepts in a simplified form, which will be further described in the Detailed Description below. The summary part is neither intended to identify key features or main features of the present disclosure, nor intended to limit the scope of the present disclosure.

BRIEF DESCRIPTION OF THE DRAWINGS

By description of example embodiments of the present disclosure in more detail with reference to the accompanying drawings, the above and other objectives, features, and advantages of the present disclosure will become more apparent. In the example embodiments of the present disclosure, the same reference numerals generally represent the same components. In the drawings.

DETAILED DESCRIPTION

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

The principles of the present disclosure will be described below with reference to some example embodiments shown in the accompanying drawings. Although preferred embodiments of the present disclosure are shown in the accompanying drawings, it should be understood that these embodiments are described merely to enable those skilled in the art to better understand and then implement the present disclosure, and do not limit the scope of the present disclosure in any way.

The term "including" and variants thereof used herein indicate open-ended inclusion, that is, "including, but not limited to." Unless specifically stated, the term "or" indicates "and/or." The term "based on" indicates "based at least in part on." The terms "an example embodiment" and "an embodiment" indicate "at least one example embodiment." The term "another embodiment" indicates "at least one additional embodiment." The terms "first," "second," and the like may refer to different or identical objects. Other explicit and implicit definitions may also be included below.

The term "compression rate" as used herein refers to a ratio of a size of data or a data block after compression to its size before compression. For example, if a data block has a size of 100 M before compression and has a size of 60 M after compression, the compression rate is 60% or 0.6. Therefore, herein, the smaller the compression rate, the greater the degree of compression of data or a data block, and vice versa.

Correspondingly, the term "incompressible" and its variants mean that a size of data or a data block after compression may be greater than or equal to a size of the data or data block before compression, or the degree of compression of the data or data block may be very small. In other words, the term "incompressible" and its variants may indicate that the compression rate of data or a data block may be greater than or equal to a threshold. The threshold is, for example, 1, 0.9, 0.85, and the like.

Figure 1:
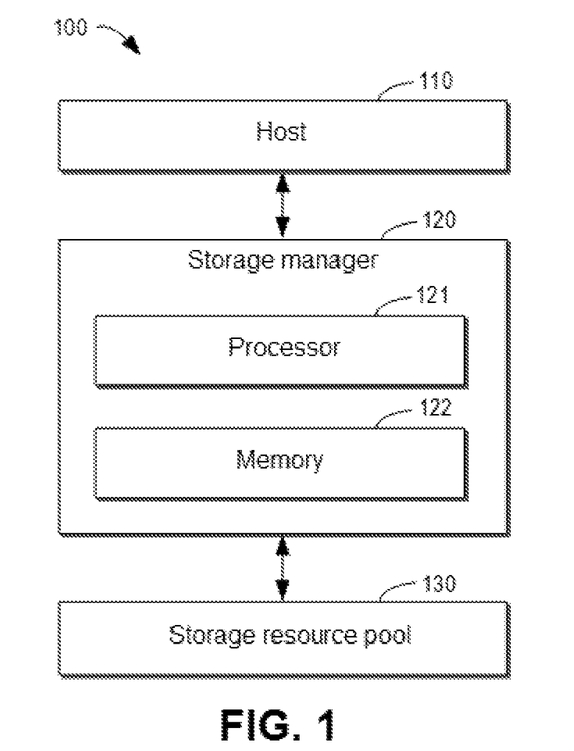
FIG. 1 illustrates a schematic diagram of an example environment where an embodiment of the present disclosure may be implemented.

FIG. 1 illustrates a block diagram of example environment 100 where an embodiment of the present disclosure can be implemented. As shown in FIG. 1, environment 100 includes host 110, storage manager 120, and storage resource pool 130. Environment 100 shown here may include a storage system or part of a storage system. It should be understood that the structure and function of environment 100 are described for illustrative purpose only, and do not imply any limitation to the scope of the present disclosure. For example, the embodiments of the present disclosure can also be applied to an environment different from environment 100.

Storage resource pool 130 may include one or more storage disks, such as a magnetic disk, an optical disk, or a solid state disk (SSD). Each storage disk may be divided into a plurality of disk slices. For example, each disk slice may have the same size. A plurality of disk slices allocated on a plurality of physical disks may be organized into storage units to store data.

Storage manager 120 may include processor 121 and memory 122. Memory 122 may be any volatile storage medium, non-volatile storage medium, or a combination thereof, which is currently known or to be developed in the future. Storage manager 120 may be configured to manage storage resource pool 130 and process input/output (I/O) requests from host 110. Host 110 may be any physical computer, virtual machine, server, etc. that runs user applications.

Host 110 may send an I/O request to storage manager 120, and the I/O request is, for example, used to read data from a storage unit in storage resource pool 130 and/or write data to the storage unit. If an I/O request from host 110 is received and the I/O request is a write request, storage manager 120 may forward the I/O request to the storage unit in storage resource pool 130, so as to write data to the storage unit. Data writing is usually performed in units of data blocks.

As mentioned above, in order to save storage space, before writing data blocks to the storage unit, the storage manager usually compresses the received data blocks first, and then writes the compressed data blocks into the storage unit in the storage resource pool. This mode is called online compression. A storage system usually maintains a virtual mapping table to manage metadata related to online compression.

In addition, some storage systems also support data deduplication, which may also be referred to as "online deduplication" for short. The received data blocks may be deduplicated online first and then compressed online.

Such storage system is taken as an example. When online deduplication is enabled, each of the received data blocks will be compressed. If the data blocks are actually incompressible, a lot of computing resources, such as CPU, will be consumed. If the degree of compression of the data blocks is very limited, for example, the compression rate being greater than 85%, the resulting storage space saving will be very limited. In addition, data compression and subsequent data decompression consume a lot of computing resources and time. On the whole, data compression is not appropriate in this case.

When online deduplication is disabled and incompressible data blocks appear continuously, an engine used for data compression may be shut down for a period of time. Data blocks involved in all I/O write requests during this period of time will not be compressed. For example, a certain acceleration mode may be used to perform direct I/O processing on the data blocks. However, this mode usually has a lot of misjudgments, resulting in some compressible data blocks being skipped.

In view of the above situation, whether blindly choosing to compress all data blocks or blindly skipping the compression of some data blocks within a period of time has corresponding problems. Therefore, a scheme is needed to determine whether data or data blocks are compressible.

A data compression scheme is proposed in the embodiments of the present disclosure to solve the above problem and one or more of other potential problems. In this scheme, a plurality of bit strings (for example, a plurality of bytes) are selected from a data block as sample data. Then, a set of characters included in the sample data are determined. Each character is represented by at least one bit string among the plurality of bit strings. Next, it is determined whether statistical characteristics of the set of characters match predetermined statistical characteristics. The statistical characteristics may include one or more quantitative features related to the set of characters. If the statistical characteristics of the set of characters match the predetermined statistical characteristics, the data block is compressed. If the statistical characteristics of the set of characters do not match the predetermined statistical characteristics, the compression of the data block is skipped.

In the proposed scheme, the compressibility of a data block is detected by analyzing sample data of the data block, and the data block is compressed only when it is compressible. This scheme may also be called a self-adaptive data compression scheme. In this way, it is possible to alleviate or even avoid wasting computing resources on incompressible data, thereby optimizing the use of computing resources. In addition, part of data (i.e., sample data) of a data block, instead of the entire data block, is analyzed in the proposed scheme. This helps to quickly determine the compressibility of the data block without consuming excessive resources. Therefore, the embodiments of the present disclosure can quickly detect the compressibility of data blocks, thereby optimizing the use of computing resources and improving system performance.

It should be understood that although the proposed self-adaptive data compression scheme is mainly described in the context of data storage herein, this self-adaptive data compression scheme may be used for compressing data in any suitable data processing (for example, data encryption and data transmission).

Figure 2:
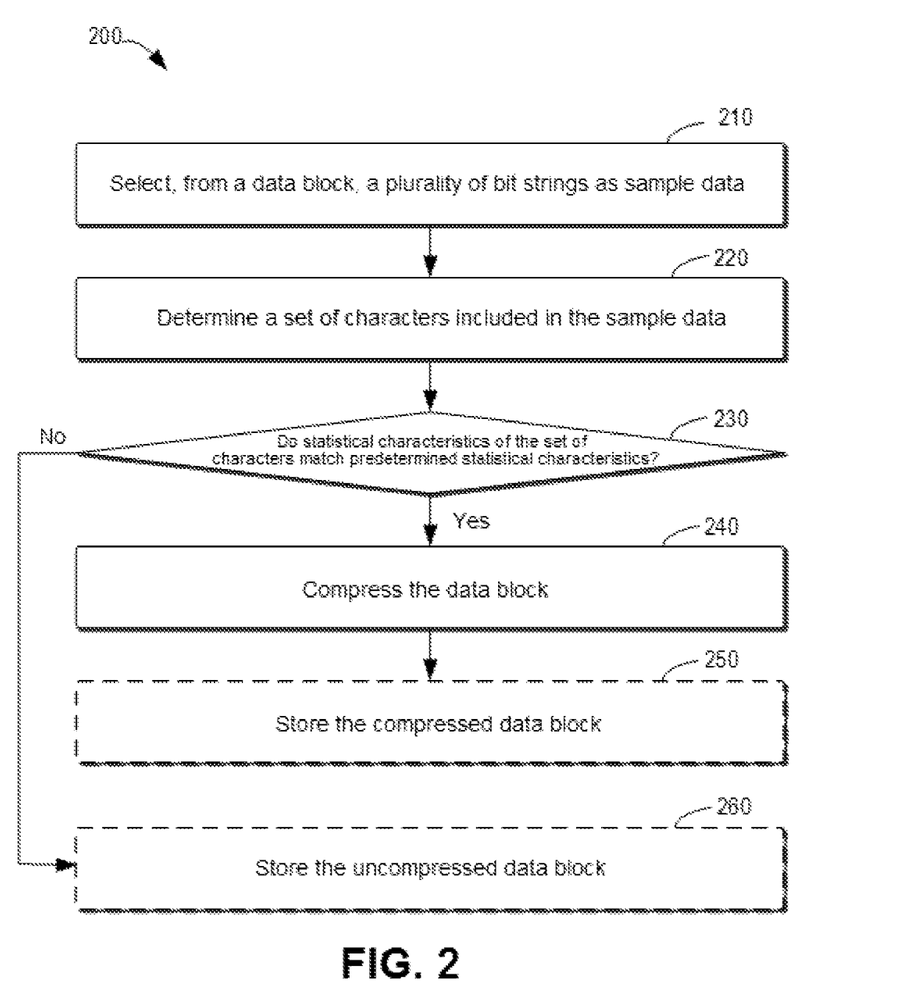
FIG. 2 shows a flowchart of an example method for data compression according to an embodiment of the present disclosure.

FIG. 2 shows a flowchart of example method 200 for data compression according to an embodiment of the present disclosure. Method 200 may be, for example, performed by storage manager 120 (for example, processor 121) as shown in FIG. 1. It should be understood that method 200 may also include additional actions not shown and/or omit actions shown, and the scope of the present disclosure is not limited in this regard. Method 200 is described in detail below with reference to FIG. 1.

Storage manager 120 receives a data block to be written from host 110. The data block may have any suitable size, for example, 8 KB. At block 210, storage manager 120 selects, from a data block, a plurality of bit strings as sample data. In other words, storage manager 120 may sample the data block. The plurality of bit strings selected as sample data may also be referred to as a plurality of sampled bit strings. The "bit string" described here may correspond to or represent a character. For example, the character may refer to the value of a bit string. The number of bits in the bit string may depend on a coding mode. For example, in some embodiments, one bit string may be one byte. In other embodiments, a bit string may be two bytes.

The number of the plurality of bit strings as sample data may depend on the size of the data block and the maximum number of unique characters that can be represented by the data block. As an example, it is assumed that the data block has a size of 8 KB, and the maximum number of unique characters that can be represented by the data block is 256 (i.e., one byte corresponds to one character). In this case, the size of the sample data is limited to 512 bit strings, that is, at most 512 bytes are sampled for each data block of 8 KB. That is, storage manager 120 will select 512 bytes from the data block as sample data.

In some application scenarios, the maximum number of unique characters that can be represented by the data block is much less than 256. In these application scenarios, a smaller number of bit strings may be selected as sample data. In this way, by sampling less data, computing resources and time spent in detecting the compressibility of the data block can be reduced. Therefore, the data compression scheme according to the present disclosure has flexibility in sample data selection.

In some embodiments, storage manager 120 may randomly select a predetermined number (for example, 512) of bit strings from the data block. Continue with the above sample data including 512 bytes as an example. Storage manager 120 may randomly select 32 positions in the data block, and select consecutive 16 bytes starting with each position. In this way, 512 bytes as sample data may be determined.

In some embodiments, storage manager 120 may use a system sampling method to select sample data from the data block. For example, storage manager 120 may select a plurality of bit strings from the data block as sample data based on a predetermined step length and a predetermined interval. The predetermined step length may also be referred to as a sampling step length or a sampling size, which corresponds to the number of consecutive bits selected, and the predetermined interval may also be referred to as a sampling interval, which corresponds to a range from which a bit string can be selected as sample data.

In some embodiments, bit may be used as the unit of the predetermined step length and the predetermined interval. In this embodiment, the predetermined step length may represent the number of consecutive bits selected within the sampling interval.

In some embodiments, bit string (for example, byte) may be used as the unit of the predetermined step length and the predetermined interval. In this embodiment, the predetermined step length may represent the number of consecutive bit strings selected within the sampling interval. In the above-mentioned example where the sample data includes 512 bytes, the predetermined interval may be 256 bytes, and the predetermined step length may be 16 bytes. That is, storage manager 120 may select consecutive 16 bytes from every 256 bytes. In this way, if (or when) the data block has a size of 8 KB, a total of 512 bytes of sample data will be obtained.

Figure 3:
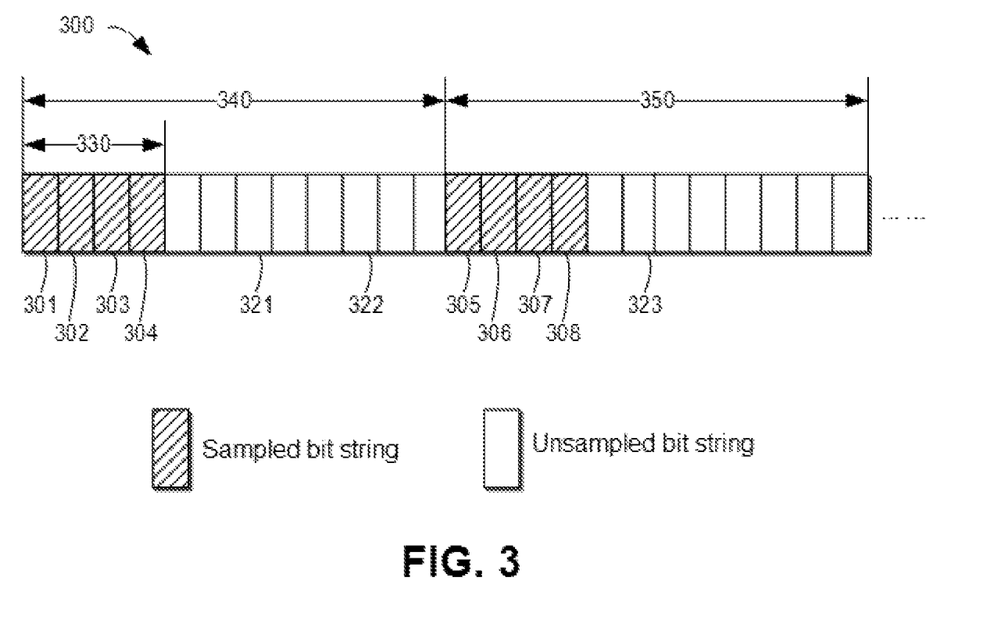
FIG. 3 illustrates a schematic diagram of selecting sample data from a data block according to some embodiments of the present disclosure.

An example is described below with reference to FIG. 3. FIG. 3 illustrates a schematic diagram of selecting sample data from data block 300 according to some embodiments of the present disclosure. In the example of FIG. 3, bit string is used as the unit of the sampling step length and the sampling interval. Storage manager 120 may select bit strings 301, 302, 303, and 304 with the total length being sampling step length 330 as a part of sample data within sampling interval 340. Similarly, storage manager 120 may select bit strings 305, 306, 307, and 308 as a part of sample data within subsequent sampling interval 350. This way lasts until a predetermined number (for example, 512) of bit strings are selected.

As shown in FIG. 3, bit strings 301 to 308 are sampled as sample data, while bit strings such as bit strings 321, 322, and 323 are not sampled. It should be understood that the lengths of the sampling step length and the sampling interval shown in FIG. 3 are illustrative only and not intended to limit the scope of the present disclosure.

Still referring to FIG. 2, at block 220, storage manager 120 determines a set of characters included in the sample data. Each character in the set of characters is represented by at least one bit string among the plurality of sampled bit strings. For example, storage manager 120 may determine a character represented by each of the plurality of sampled bit strings 301 to 308. It can be understood that the value of a bit string corresponds to a character, so the bit string may represent the character.

In some embodiments, the characters in the set of characters are different from one another. Storage manager 120 may determine the character represented by each of the plurality of sampled bit strings, and then deduplicate and count the same characters. For example, if at least two bit strings among the plurality of sampled bit strings represent the same character, the character may be added to the set of characters, and the number of bit strings representing the character may be counted.

At block 230, storage manager 120 determines whether statistical characteristics of the set of characters match predetermined statistical characteristics. The statistical characteristics described herein may include one or more quantitative features related to the set of characters, for example, the number of characters, the numbers of appearances of characters in the sample data, and any measurement or counting features that may be derived therefrom. Such statistical features may reflect the amount of information conveyed by the sample data, which in turn may reflect the amount of information contained in the data block. Herein, actions at block 230 may be collectively referred to as compressibility detection based on statistical characteristics. Block 230 will be described in detail below with reference to FIG. 4.

If it is determined at block 230 that the statistical characteristics of the set of characters match the predetermined statistical characteristics, method 200 may proceed to block 240. At block 240, storage manager 120 compresses the data block. In other words, if the statistical characteristics of the set of characters match the predetermined statistical characteristics, the corresponding data block may be considered as compressible.

In some embodiments, storage manager 120 may compress the data block using a local processing unit (for example, processor 121). Alternatively or additionally, in some embodiments, storage manager 120 may compress at least a part of the data block using accelerator resources. The accelerator resources refer to some processing resources with an acceleration function, for example, a co-processor, which can assist a CPU to perform some tasks such as a data compression task. Environment 100 may be deployed with such accelerator resources, and storage manager 120 may request the use of the accelerator resources to compress the data block. Such accelerator resources may include, for example, quick assist technology (QAT) cards. Compressing the data block using the accelerator resources can further reduce the burden on the CPU.

In some embodiments, depending on the statistical characteristics of the set of characters, storage manager 120 may initiate different compression operations to compress the data block. Different compression operations may be based on different compression algorithms, and the degrees of compression of the data block may be different. This will be described below with reference to FIG. 4.

Still referring to FIG. 2, in some embodiments, for example in a data storage scenario, at block 250, storage manager 120 may store a compressed data block. For example, the compressed data block may be written into a storage unit in storage resource pool 130. In other data processing scenarios, the compressed data block may be processed accordingly, for example, transmitted and encrypted.

If it is determined at block 230 that the statistical characteristics of the set of characters do not match the predetermined statistical characteristics, the corresponding data block will not be compressed. That is, if the statistical characteristics of the set of characters do not match the predetermined statistical characteristics, the corresponding data block may be considered as incompressible. In a scenario of data storage, method 200 may proceed to block 260. At block 260, storage manager 120 may store an uncompressed data block. For example, the uncompressed data block may be written into a storage unit in storage resource pool 130. In other data processing scenarios, the uncompressed data block may be processed accordingly, for example, transmitted and encrypted.

In some embodiments, before method 200 proceeds to block 220, storage manager 120 may determine the number of bit strings being zero among the plurality of sampled bit strings. For example, storage manager 120 may determine the number of bytes being zero among a plurality of sampled bytes. If the number of bit strings being zero exceeds a threshold, the data block may be considered as compressible, and method 200 may proceed to block 240. If the number of bit strings being zero does not exceed the threshold, method 200 may proceed to block 220 to perform compression detection based on statistical characteristics at block 230.

Alternatively or additionally, in some embodiments, before method 200 proceeds to block 220, storage manager 120 may determine whether the plurality of sampled bit strings have symmetry. If the plurality of sampled bit strings have symmetry, the corresponding data block may be considered as compressible, and method 200 may proceed to block 240. If the plurality of sampled bit strings do not have symmetry, method 200 may proceed to block 220 to perform compression detection based on statistical characteristics at block 230. The symmetry described here may be defined based on relative positions of the bit strings in the data block. For example, storage manager 120 may determine whether a bit string located in the first half of the data block is symmetrical with a bit string located in the second half of the data block among the plurality of bit strings.

In the data compression method described above, the compressibility of a data block can be quickly determined by analyzing sample data of the data block, instead of the entire data block, so as to avoid spending computing resources and time to compress an otherwise incompressible data block. In addition, statistical characteristics of characters included in the sample data are used to analyze the sample data. The statistical characteristics may reflect the amount of information conveyed by the sample data. In this way, the accuracy of detection of the compressibility of the data block can be guaranteed.

Figure 4:
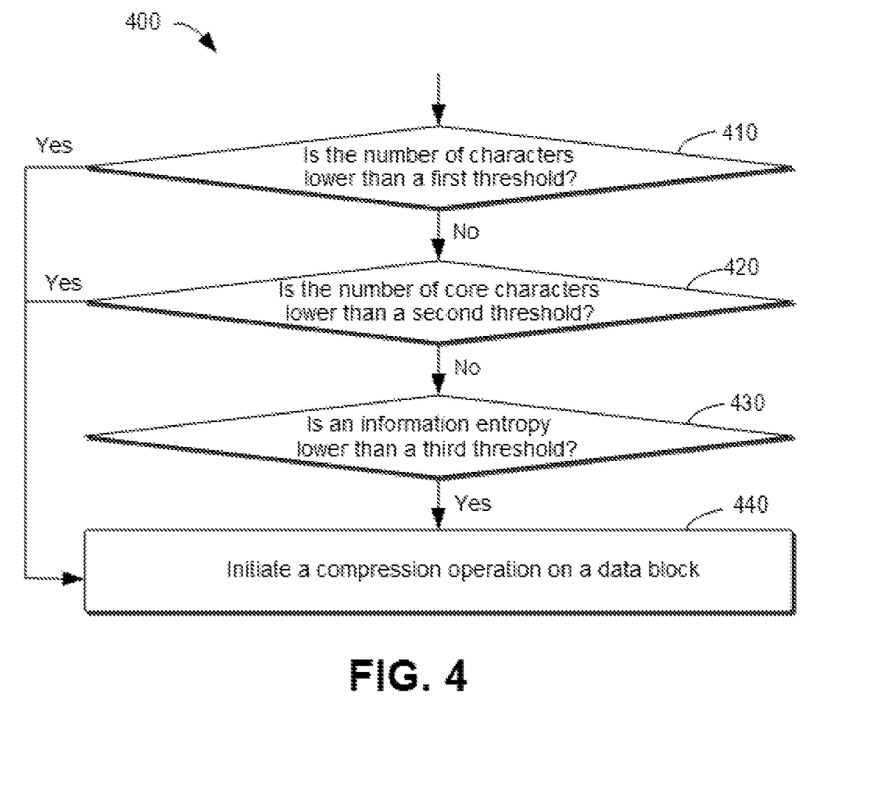
FIG. 4 shows a flowchart of an example method for determining compressibility according to some embodiments of the present disclosure.

The compressibility detection based on statistical characteristics will be described in detail below. FIG. 4 shows a flowchart of example method 400 for determining compressibility according to some embodiments of the present disclosure. Method 400 may be, for example, performed by storage manager 120 as shown in FIG. 1. It should be understood that method 400 may further include additional actions not shown and/or may omit actions shown. The scope of the present disclosure is not limited in this regard. One or more of blocks 410, 420, and 430 or any combination thereof may be regarded as an implementation of block 230. Block 440 may be considered as an implementation of block 240.

At block 410, storage manager 120 determines whether the number of characters in the set of characters is lower than a first threshold. For example, storage manager 120 may determine whether the number of characters different from each other in the set of characters is lower than the first threshold. The number of characters is related to a size of a character set (for example, a byte set) of the data block. A small number of characters means that the character set of the data block is likely to be small. The mode described with reference to block 410 is also referred to herein as character number detection.

The character number detection may be used to detect text data, such as xml, json, html, and other data. In most text data, the character set is limited to a limited number of possible characters, and this limitation makes data easy to compress. Therefore, if the number of characters is lower than the first threshold, it may be considered that the character set of the data block is small, and it may be determined that the data block is compressible.

Accordingly, if it is determined at block 410 that the number of characters is lower than the first threshold, method 400 proceeds to block 440. At block 440, storage manager 120 initiates a compression operation on the data block. The compression operation initiated in this case may also be referred to as a "first compression operation."

If it is determined at block 410 that the number of characters is not lower than the first threshold, method 400 proceeds to block 420. At block 420, storage manager 120 determines whether the number of core characters in the set of characters is lower than a second threshold. A percent of bit strings representing the core characters in the plurality of sampled bit strings exceeds a threshold percent, for example, 90%. In other words, the core characters cover sampled data at a percent exceeding the threshold percent.

As an example, storage manager 120 may determine the number of times each character in the set of characters appears in the sample data, which is also referred to as the number of appearances. The number of appearances of a specific character is the number of bit strings representing the specific character in the plurality of sampled bit strings. In some embodiments, the determination of the number of appearances may be implemented at block 220. In some embodiments, the determination of the number of occurrences may be implemented at block 420. Then, storage manager 120 may sort the set of characters in a descending order according to the numbers of appearances. That is, the character with the highest ranking has the maximum number of appearances.

Next, storage manager 120 may determine characters having a ratio of a sum of numbers of appearances to a total number of the plurality of sampled bit strings exceeding a threshold ratio (for example, 90%) as core characters in a descending order. Furthermore, storage manager 120 may determine whether the number of core characters is lower than a second threshold.

Alternatively, it is assumed that the second threshold is N. Storage manager 120 may also determine a ratio of a sum of numbers of appearances of the first N characters in the sorted order to the total number of the plurality of sampled bit strings. If the ratio exceeds the threshold ratio, storage manager 120 may determine that the number of core characters is lower than the second threshold. If the ratio does not exceed the threshold ratio, storage manager 120 may determine that the number of core characters is not lower than the second threshold.

The number of core characters is related to the data distribution of the data block. The mode described with reference to block 420 is also referred to herein as data distribution detection. If the number of core characters is lower than the second threshold, it means that most of the data block may include frequent repetition of core characters. A data block with this data distribution is easy to compress. Accordingly, if it is determined at block 420 that the number of core characters is lower than the second threshold, method 400 proceeds to block 440. At block 440, storage manager 120 initiates a compression operation on the data block. The compression operation initiated in this case may also be referred to as a "second compression operation."

In some embodiments, if it is determined at block 420 that the number of core characters is not lower than the second threshold, method 400 proceeds to block 430, as shown in FIG. 4.

In other embodiments, a lower limit of core characters and an upper limit of core characters may be set. The lower limit of core characters may be used as the above second threshold. If the number of core characters exceeds the upper limit of core characters, it means that the data block may have uniform data distribution, and there is a high probability that the data block is incompressible. For example, some types of structured data may contain almost all possible characters (for example, byte values). A data block that is such structured data usually has uniform data distribution, that is, the numbers of appearances of different characters will be basically the same or very close. Such a data block (for example, encrypted data) is unlikely to be compressible. Accordingly, in this embodiment, if it is determined at block 420 that the number of core characters exceeds the upper limit of core characters, it may be determined that the data block is incompressible. Storage manager 120 may skip the compression operation on the data block.

In contrast, if the number of core characters exceeds the lower limit of core characters (i.e., the second threshold) but is lower than the upper limit of core characters, the corresponding data block may be potentially compressible, and the compressibility of the data block needs to be further determined. For example, a data block with normal distribution may be in this case. Accordingly, in this embodiment, if it is determined at block 420 that the number of core characters is not lower than the second threshold but lower than the upper limit of core characters, method 400 proceeds to block 430.

At block 430, storage manager 120 determines whether an information entropy of the sample data is lower than a third threshold. Specifically, storage manager 120 may determine an information entropy of the sample data based on the number of the plurality of sampled bit strings and the number of times each character in the set of characters appears in the sample data. The numbers of appearances of characters may be determined as described above with reference to block 420. The mode described with reference to block 430 may also be referred to as information entropy detection.

Information entropy is a quantitative measure of information, which may represent an average amount of information after excluding redundancy in the information. Information entropy is related to the uncertainty of appearance of an individual character and the number of all individual characters that may appear. Storage manager 120 may determine the uncertainty of appearance of an individual character based on the number of appearances of the individual character in the set of characters and the number of the plurality of sampled bit strings, for example, taking the logarithm of an inverse of an appearance probability of the individual character. Then, storage manager 120 may determine the statistical average of the uncertainties of individual characters in the set of characters as the information entropy of the sample data. The information entropy described here may represent an average minimum number of bits required to code the sample data. When the bit string is bytes, the information entropy may also be called a byte entropy.

The information entropy is an accurate estimation on the benefit of data compression. The compression of data with a lower information entropy is usually more effective, that is, has a higher benefit. Therefore, if a information entropy of sample data is low, it means that the data block has a large probability of being compressible, and if the information entropy of the sample data is high, it means that the data block has a large probability of being incompressible.

Accordingly, if it is determined at block 430 that the information entropy is lower than the third threshold, method 400 proceeds to block 440. At block 440, storage manager 120 initiates a compression operation on the data block. The compression operation initiated in this case may also be referred to as a "third compression operation." If it is determined at block 430 that the information entropy is not lower than the third threshold, it may be determined that the data block is incompressible. Storage manager 120 will skip the compression of the data block.

Example method 400 described above may be regarded as a type of heuristics. This type of heuristics includes multi-level detection, namely, character number detection, data distribution detection, and information entropy detection. The sequence of the multi-level detection shown in FIG. 4 is determined based on the corresponding computing amount/time. The computations involved gradually increase from top to bottom in the order shown in FIG. 4. In this embodiment, the multi-level detection is performed in the order shown in the figure, such that a determination about whether the data block is compressible can be made as early as possible, thereby reducing the computing overhead.

In some embodiments, different compression operations may be performed for data blocks with different potential compression degrees. As previously mentioned, different compression operations may be based on different compression algorithms. For example, the degrees of compression of the data block by the first and second compression operations may be greater than the degree of compression of the data block by the third compression operation. In other words, compared with the third compression operation, the first and second compression operations may be based on a compression algorithm with a lower compression rate.

As mentioned above, the information entropy is an accurate estimation on the benefit of data compression. In some embodiments, based on the information entropy, a compression operation having the degree of compression matching a magnitude of the information entropy may be selected from predetermined compression operations as the third compression operation. For example, a compression algorithm may be selected based on the magnitude of the information entropy determined at block 430, and the data block is compressed using the compression algorithm. If the information entropy is relatively small, a compression algorithm with a larger degree of compression may be selected. If the information entropy is relatively large, a compression algorithm with a smaller degree of compression may be selected.

In these embodiments, the selection and use of compression algorithms are further refined. In this way, different compression algorithms may be used to process data blocks that potentially have different compression rates. This is beneficial to further improvement of the efficiency of a system (for example, storage system) applying the data compression scheme of the present disclosure.

It should be understood that the character number detection (corresponding to block 410), data distribution detection (corresponding to block 420), and information entropy detection (corresponding to block 430) described with reference to FIG. 4 may be applied separately or in a combined manner, without being limited to the heuristics based on multi-level detection shown in FIG. 4. In some embodiments, any one of character number detection, data distribution detection, and information entropy detection may be separately applied. In other embodiments, any two of character number detection, data distribution detection, and information entropy detection may be combined to achieve two-level detection.

It can be seen from the above description that the embodiments of the present disclosure provide a data compression scheme. The scheme can quickly determine the compressibility of data to avoid wasting computing resources to process incompressible data. In other words, the data compression scheme of the present disclosure can efficiently and accurately filter out incompressible data, so as to achieve more effective utilization of computing resources (for example, CPU) for real-time data compression.

A storage system is taken as an example. The scheme allows the storage system to use its precious computing resources for data that can be better compressed, and avoids compressing data that is otherwise incompressible or low in compression yield as much as possible. In this way, the computing resources can be used to compress other data and better serve I/O requests, thereby saving costs and improving performance. When a storage device with high I/O throughput (for example, a non-volatile memory SSD, NVMe SSD) is introduced into storage resource pool 130, CPU cycles will become more precious. With the solution according to the present disclosure, efficient utilization of the CPU can be realized to achieve better final I/O throughput. It can be understood that when the data compression scheme according to the present disclosure is applied to other systems, similar benefits may also be achieved.

Figure 5:
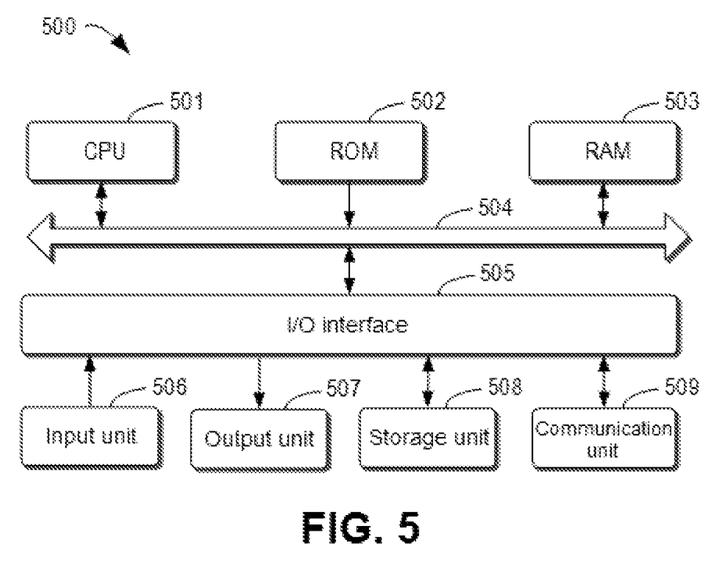
FIG. 5 illustrates a block diagram of an example device that may be configured to implement an embodiment of the present disclosure.

FIG. 5 illustrates a schematic block diagram of example device 500 that may be configured to implement an embodiment of content of the present disclosure. For example, storage manager 120 as shown in FIG. 1 may be implemented by device 500. As shown in FIG. 5, device 500 includes CPU 501 that may execute various appropriate actions and processing in accordance with computer program instructions stored in read-only memory (ROM) 502 or computer program instructions loaded onto random access memory (RAM) 503 from storage unit 508. In RAM 503, various programs and data required for the operation of device 500 may also be stored. CPU 501, ROM 502, and RAM 503 are connected to each other by bus 504. Input/output (I/O) interface 505 is also connected to bus 504.

A plurality of members in device 500 are connected to I/O interface 505, including: input unit 506, such as a keyboard and a mouse; output unit 507, such as various types of displays and speakers; storage unit 508, such as a magnetic disk and an optical disk; and communication unit 509, such as a network card, a modem, and a wireless communication transceiver. Communication unit 509 allows device 500 to exchange information/data with other devices via a computer network such as the Internet and/or various telecommunication networks.

The various processes and processing described above, such as method 200 and/or method 400, may be performed by processing unit 501. For example, in some embodiments, method 200 and/or method 400 may be implemented as a computer software program that is tangibly included in a machine-readable medium, such as storage unit 508. In some embodiments, some or all of the computer program may be loaded and/or installed onto device 500 via ROM 502 and/or communication unit 509. When the computer program is loaded to RAM 503 and executed by CPU 501, one or more actions of method 200 and/or method 400 described above may be executed.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device that may retain and store instructions for use by an instruction-executing device. For example, the computer-readable storage medium may be, but is not limited to, an electrical storage device, a magnetic storage device, an optical storage device, an electromagnetic storage device, a semiconductor storage device, or any suitable combination of the above. More specific examples (a non-exhaustive list) of the computer-readable storage medium include: a portable computer disk, a hard disk, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical coding device such as a punch card or protrusions in a groove on which instructions are stored, and any appropriate combination of the above. The computer-readable storage medium used here is not construed as transient signals themselves, such as radio waves or other freely propagating electromagnetic waves, electromagnetic waves propagating through waveguides or other transmission media (for example, optical pulses through fiber-optic cables), or electrical signals transmitted through electrical wires.

The computer-readable program instructions described herein can be downloaded from a computer-readable storage medium to various computing/processing devices, or downloaded to an external computer or external storage device via a network such as the Internet, a local area network, a wide area network, and/or a wireless network. The network may include copper transmission cables, optical fiber transmission, wireless transmission, routers, firewalls, switches, gateway computers, and/or edge servers. A network adapter card or network interface in each computing/processing device receives computer-readable program instructions from the network and forwards the computer-readable program instructions for storage in the computer-readable storage medium in each computing/processing device.

The computer program instructions for performing the operations of the present disclosure may be assembly instructions, instruction set architecture (ISA) instructions, machine instructions, machine-related instructions, microcode, firmware instructions, state setting data, or source code or object code written in any combination of one or more programming languages. The programming languages include object-oriented programming languages such as Smalltalk and C++ and conventional procedural programming languages such as "C" language or similar programming languages. The computer-readable program instructions may be executed entirely on a user computer, partly on a user computer, as a standalone software package, partly on a user computer and partly on a remote computer, or entirely on a remote computer or a server. In the case where a remote computer is involved, the remote computer can be connected to a user computer over any kind of networks, including a local area network (LAN) or a wide area network (WAN), or can be connected to an external computer (e.g., connected over the Internet using an Internet service provider). In some embodiments, an electronic circuit, such as a programmable logic circuit, a field programmable gate array (FPGA), or a programmable logic array (PLA), is customized by utilizing state information of the computer-readable program instructions. The electronic circuit may execute the computer-readable program instructions so as to implement various aspects of the present disclosure.

Various aspects of the present disclosure are described here with reference to flowcharts and/or block diagrams of the methods, the apparatuses (systems), and the computer program products according to the embodiments of the present disclosure. It should be understood that each block in the flowcharts and/or block diagrams as well as a combination of blocks in the flowcharts and/or block diagrams may be implemented by using the computer-readable program instructions.

The computer-readable program instructions may be provided to a processing unit of a general purpose computer, a special purpose computer, or other programmable data processing apparatuses to produce a machine, such that the instructions, when executed by the processing unit of the computer or other programmable data processing apparatuses, generate an apparatus for implementing the functions/actions specified in one or more blocks in the flowcharts and/or block diagrams. The computer-readable program instructions may also be stored in a computer-readable storage medium, to cause a computer, a programmable data processing apparatus, and/or other devices to work in a specific manner, such that the computer-readable medium storing the instructions includes an article of manufacture that contains instructions for implementing various aspects of the functions/actions specified in one or more blocks in the flowcharts and/or block diagrams.

The computer-readable program instructions may also be loaded onto a computer, other programmable data processing apparatuses, or other devices, so that a series of operating steps are performed on the computer, other programmable data processing apparatuses, or other devices to produce a computer-implemented process, so that the instructions executed on the computer, other programmable data processing apparatuses, or other devices implement the functions/actions specified in one or more blocks in the flowcharts and/or block diagrams.

The flowcharts and block diagrams in the accompanying drawings show the architectures, functionalities, and operations of possible implementations of the system, the method, and the computer program product according to a plurality of embodiments of the present disclosure. In this regard, each block in the flowcharts or block diagrams may represent a module, a program segment, or part of an instruction, the module, program segment, or part of an instruction including one or more executable instructions for implementing specified logical functions. In some alternative implementations, the functions marked in the blocks may also occur in an order different from that marked in the accompanying drawings. For example, two successive blocks may actually be performed basically in parallel, or they may be performed in an opposite order sometimes, depending on the functions involved. It should be further noted that each block in the block diagrams and/or flowcharts as well as a combination of blocks in the block diagrams and/or flowcharts may be implemented by using a dedicated hardware-based system for executing specified functions or actions or by a combination of dedicated hardware and computer instructions.

The embodiments of the present disclosure have been described above. The above description is illustrative, rather than exhaustive, and is not limited to the disclosed embodiments. Numerous modifications and alterations are apparent to those of ordinary skill in the art without departing from the scope and spirit of illustrated various embodiments. The selection of terms used herein is intended to best explain the principles and practical applications of the embodiments or the improvements to technologies on the market, or to enable other persons of ordinary skill in the art to understand the embodiments disclosed herein.

The invention claimed is:

1. A data compression method, comprising:
   selecting, from a data block, a plurality of bit strings as sample data;
   determining a set of characters comprised in the sample data, each character in the set of characters being represented by at least one bit string among the plurality of bit strings; and
   compressing the data block if statistical characteristics of the set of characters match predetermined statistical characteristics.

2. The method according to claim 1, wherein compressing the data block comprises:

initiating a first compression operation on the data block if it is determined that the number of characters in the set of characters is lower than a first threshold.

3. The method according to claim 2, further comprising:
determining the number of core characters in the set of characters if it is determined that the number of characters is not lower than the first threshold, a percent of bit strings representing the core characters in the plurality of bit strings exceeding a threshold percent; and
initiating a second compression operation on the data block if it is determined that the number of the core characters is lower than a second threshold.

4. The method according to claim 3, further comprising:
determining, if it is determined that the number of the core characters is not lower than the second threshold, an information entropy of the sample data based on the number of the plurality of bit strings and the number of times each character in the set of characters appears in the sample data; and
initiating a third compression operation on the data block if the information entropy is lower than a third threshold.

5. The method according to claim 4, wherein the degrees of compression of the data block by the first compression operation and the second compression operation exceed the degree of compression of the data block by the third compression operation.

6. The method according to claim 1, wherein compressing the data block comprises:
determining the number of core characters in the set of characters, a percent of bit strings representing the core characters in the plurality of bit strings exceeding a threshold percent; and
initiating a second compression operation on the data block if it is determined that the number of the core characters is lower than a second threshold.

7. The method according to claim 1, wherein compressing the data block comprises:
determining an information entropy of the sample data based on the number of the plurality of bit strings and the number of times each character in the set of characters appears in the sample data; and
initiating a third compression operation on the data block if the information entropy is lower than a third threshold.

8. The method according to claim 7, wherein initiating the third compression operation on the data block comprises:
selecting the third compression operation from predetermined compression operations based on the information entropy, the degree of compression of the data block by the third compression operation matching the size of the information entropy; and
making the data block compressed based on the third compression operation.

9. The method according to claim 1, wherein selecting the sample data comprises:
selecting, from the data block and based on a predetermined step length and a predetermined interval, the plurality of bit strings as the sample data, the predetermined step length corresponding to the number of consecutive bits selected within the predetermined interval.

10. The method according to claim 1, wherein initiating a compression operation on the data block comprises:
compressing at least a part of the data block using accelerator resources.

11. An electronic device, comprising:
a processor; and
a memory coupled to the processor and having instructions stored therein, wherein the instructions, when executed by the processor, cause the device to execute actions comprising:
selecting, from a data block, a plurality of bit strings as sample data;
determining a set of characters comprised in the sample data, each character among the set of characters being represented by at least one bit string among the plurality of bit strings; and
compressing the data block if statistical characteristics of the set of characters match predetermined statistical characteristics.

12. The device according to claim 11, wherein compressing the data block comprises:
initiating a first compression operation on the data block if it is determined that the number of characters in the set of characters is lower than a first threshold.

13. The device according to claim 12, wherein the actions further comprise:
determining the number of core characters in the set of characters if it is determined that the number of characters is not lower than the first threshold, a percent of bit strings representing the core characters in the plurality of bit strings exceeding a threshold percent; and
initiating a second compression operation on the data block if it is determined that the number of the core characters is lower than a second threshold.

14. The device according to claim 13, wherein the actions further comprise:
determining, if it is determined that the number of the core characters is not lower than the second threshold, an information entropy of the sample data based on the number of the plurality of bit strings and the number of times each character in the set of characters appears in the sample data; and
initiating a third compression operation on the data block if the information entropy is lower than a third threshold.

15. The device according to claim 14, wherein the degrees of compression of the data block by the first compression operation and the second compression operation exceed the degree of compression of the data block by the third compression operation.

16. The device according to claim 11, wherein compressing the data block comprises:
determining the number of core characters in the set of characters, a percent of bit strings representing the core characters in the plurality of bit strings exceeding a threshold percent; and
initiating a second compression operation on the data block if it is determined that the number of the core characters is lower than a second threshold.

17. The device according to claim 11, wherein compressing the data block comprises:
determining an information entropy of the sample data based on the number of the plurality of bit strings and the number of times each character in the set of characters appears in the sample data; and
initiating a third compression operation on the data block if the information entropy is lower than a third threshold.

18. The device according to claim 17, wherein initiating the third compression operation on the data block comprises:

selecting the third compression operation from predetermined compression operations based on the information entropy, the degree of compression of the data block by the third compression operation matching the size of the information entropy; and making the data block compressed based on the third compression operation.

19. The device according to claim 11, wherein selecting the sample data comprises:

selecting, from the data block and based on a predetermined step length and a predetermined interval, the plurality of bit strings as the sample data, the predetermined step length corresponding to the number of consecutive bits selected within the predetermined interval.

20. The device according to claim 11, wherein initiating a compression operation on the data block comprises:

compressing at least a part of the data block using accelerator resources.

21. A computer program product having a non-transitory computer readable medium which stores a set of instructions to perform data compression; the set of instructions, when carried out by computerized circuitry, causing the computerized circuitry to perform a method of:

selecting, from a data block, a plurality of bit strings as sample data;

determining a set of characters comprised in the sample data, each character in the set of characters being represented by at least one bit string among the plurality of bit strings; and compressing the data block if statistical characteristics of the set of characters match predetermined statistical characteristics.

* * * * *